United States Patent [19]

Slutz et al.

[11] Patent Number: 5,387,447
[45] Date of Patent: Feb. 7, 1995

[54] METHOD FOR PRODUCING UNIFORM CYLINDRICAL TUBES OF CVD DIAMOND

[75] Inventors: David E. Slutz, Columbus; Friedel S. Knemeyer, Granville, both of Ohio

[73] Assignee: General Electric Company, Worthington, Ohio

[21] Appl. No.: 138,888

[22] Filed: Oct. 19, 1993

Related U.S. Application Data

[62] Division of Ser. No. 832,300, Feb. 7, 1992, abandoned.

[51] Int. Cl.⁶ ............................................. B28D 5/04
[52] U.S. Cl. ................................... 428/34.1; 428/212; 428/220; 428/338; 428/367; 428/408; 428/908.8; 423/446; 407/119; 125/39; 51/293; 76/107.1; 72/462
[58] Field of Search .................... 428/34.1, 213, 908.8, 428/216, 220, 408, 212, 338, 367; 423/446; 407/119; 125/39; 51/293; 76/107.1; 72/462

[56] References Cited

U.S. PATENT DOCUMENTS

| 4,707,384 | 11/1987 | Schachner et al. | 427/249 |
| 5,130,111 | 7/1992 | Pryor | 423/446 |
| 5,133,332 | 7/1992 | Tanaka et al. | 125/39 |

FOREIGN PATENT DOCUMENTS

| 0437830A1 | 7/1991 | European Pat. Off. . |
| 0442303A1 | 8/1991 | European Pat. Off. . |
| 0467634A2 | 1/1992 | European Pat. Off. . |
| 62-296707 | 5/1989 | Japan . |

OTHER PUBLICATIONS

Emerging Technology of Diamond Thin Films/Chemical & Engineering News, Vo. 67, NI. 20, pp. 24–39, 1989.

Primary Examiner—Charles R. Nold

[57] ABSTRACT

The present invention provides a method for forming uniform CVD diamond coatings on a substrate wherein diamond is deposited on a plurality of substrates which are rotated in unison during the coating process to provide for more uniform radial growth. An advantageous substrate is a wire which can be coated with a layer of CVD diamond for making components in water-jet cutting apparatus, wire-drawing dies, or other tubular articles when the wire is separated from the resulting diamond tube. Identical tubes with higher uniformity in wall thickness are among the products which can be obtained. In addition, tubes having a uniform particle size distribution along their wall thickness which supports columnar diamond growth are also provided.

5 Claims, 2 Drawing Sheets

METHOD FOR PRODUCING UNIFORM CYLINDRICAL TUBES OF CVD DIAMOND

This is a divisional of copending application Ser. No. 07/832,300 filed on Feb. 7, 1992, now abandoned.

BACKGROUND OF THE INVENTION

The present invention relates to diamond workpieces and more particularly to their fabrication based on chemical vapor deposition technology.

Its hardness and thermal properties are but two of the characteristics that make diamond useful in a variety of industrial components. Initially, natural diamond was used in a variety of abrasive applications. With the ability to synthesize diamond by high pressure/high temperature (HP/HT) techniques utilizing a catalyst/sintering aid under conditions where diamond is the thermally stable carbon phase, a variety of additional products found favor in the marketplace. Polycrystalline diamond compacts, often supported on a tungsten carbide support in cylindrical or annular form, extended the product line for diamond additionally. However, the requirement of high pressure and high temperature has been a limitation, for example, in product configuration.

Recently, industrial effort directed toward the growth of diamond at low pressures, where it is metastable, has increased dramatically. Although the ability to produce diamond by low-pressure synthesis techniques has been known, drawbacks including extremely low growth rates prevented wide commercial acceptance. Recent developments have led to higher growth rates, thus spurring recent industrial interest in the field. Additionally, the discovery of an entirely new class of solids, known as "diamondlike" carbons and hydrocarbons, is an outgrowth of such recent work.

Low pressure growth of diamond has been dubbed "chemical vapor deposition" or "CVD" in the field. Two predominant CVD techniques have found favor in the literature. One of these techniques involves the use of a dilute mixture of hydrocarbon gas (typically methane) and hydrogen wherein the hydrocarbon content usually is varied from about 0.1% to 2.5% of the total volumetric flow. The gas is introduced via a quartz tube located just above a hot tungsten filament which is electrically heated to a temperature ranging from between about 1750° and 2400° C. The gas mixture disassociates at the filament surface and diamonds are condensed onto a heated substrate placed just below the hot tungsten filament. The substrate is held in a resistance-heated boat (often molybdenum) and heated to a temperature in the region of about 500° to 1100° C.

The second technique involves the imposition of a plasma discharge to the foregoing filament process. The plasma discharge serves to increase the nucleation density, growth rate, and it is believed to enhance formation of diamond films as opposed to discrete diamond particles. Of the plasma systems that have been utilized in this area, there are three basic systems. One is a microwave plasma system, the second is an RF (inductively or capacitively coupled) plasma system, and the third is a d.c. plasma system. The RF and microwave plasma systems utilize relatively complex and expensive equipment which usually requires complex tuning or matching networks to electrically couple electrical energy to the generated plasma. Additionally, the diamond growth rate offered by these two systems can be quite modest.

Symmetrical diamond coating of an object with the hot filament CVD diamond technique can be accomplished by rotating the object about an axis parallel to the filament during deposition. However, substrate rotation can be a source of other problems. Rotating the substrate has been found to generate periodic temperature fluctuations of the surface of the object as it passes from its own day-to-night-to-day cycle, often causing the coating to fracture. Such a method is disclosed in Japanese Application No. 62-296707.

In a related process, diamond is deposited on a series of stationary substrate wires positioned around a number of filaments to enhance uniform growth on the wire. After deposition of the diamond, the coated wire is removed from the furnace and the metal is acid leached away in order to leave a diamond tube. The tubes formed have found use in water-jet cutting technology and may be useful as orifices, mixing tubes and nozzles and, in addition, they can be used as wire dies or guides.

While this technique provides diamond tubes without fracture, these procedures do not always provide uniform wall thicknesses. Techniques are desired which will provide improved uniformity in the wall thickness with uniform inner diameters.

SUMMARY OF THE INVENTION

It is an object of the present invention to provide symmetrical diamond coatings of greater uniformity.

It is another objective of the present invention to produce diamond tubes more cost effectively and efficiently and with greater uniformity in wall thickness.

It is another object of the present invention to provide an apparatus which is simple in construction and operation for producing a plurality of diamond tubes simultaneously.

It is another object of the present invention to produce diamond tubes with controlled grain structure wherein fine grained diamond particles near the inner diameter can be obtained, followed by coarser grain diamond particles near the outer diameter. The increase in grain size preferably supports columnar growth along the radius of the tube.

Upon further study of the specification and appended claims, further objects and advantages of this invention will become apparent to those skilled in the art.

These objects are achieved by methods of the present invention for the chemical vapor deposition (CVD) of a layer of diamond on a plurality of substrates held at a CVD diamond-forming temperature wherein a hydrocarbon gaseous mixture is passed over a hot filament and decomposed to form said CVD diamond layer on said substrate. The present invention specifically is directed to forming a substantially uniformly thick CVD diamond layer on a plurality of the substrates which surround a single hot filament at a uniform distance and rotate in unison on their axes. The substrates are disposed parallel about axes of rotation to the filament.

An advantageous substrate is a wire which can be coated with a layer of CVD diamond for making a nozzle, wire drawing die, or other annular article when the wire is separated from the resulting diamond annulus.

An advantage of the present invention is the minimization of thermal stresses suffered by the substrate and CVD diamond layer during deposition by the rotation methods heretofore used in the art. Another advantage is that a plurality of substantially identical coatings are produced by this technique. Therefore, a plurality of substantially identical diamond tubes can be obtained having a preferred length of about 1-20 cm, a preferred inner diameter of about 0.025 to 2.5 mm which varies by less than 1%, preferably less than 0.1% in dimension, and a uniform wall thickness preferably in the range of 1-2000 μm.

BRIEF DESCRIPTION OF THE DRAWING

Various other objects, features and attendant advantages of the present invention will be more fully appreciated as the same becomes better understood when considered in conjunction with the accompanying drawing, in which like reference characters designate the same or similar parts throughout the several views, and wherein.

DETAILED DESCRIPTION OF THE PREFERRED EMBODIMENT

Figure 1:
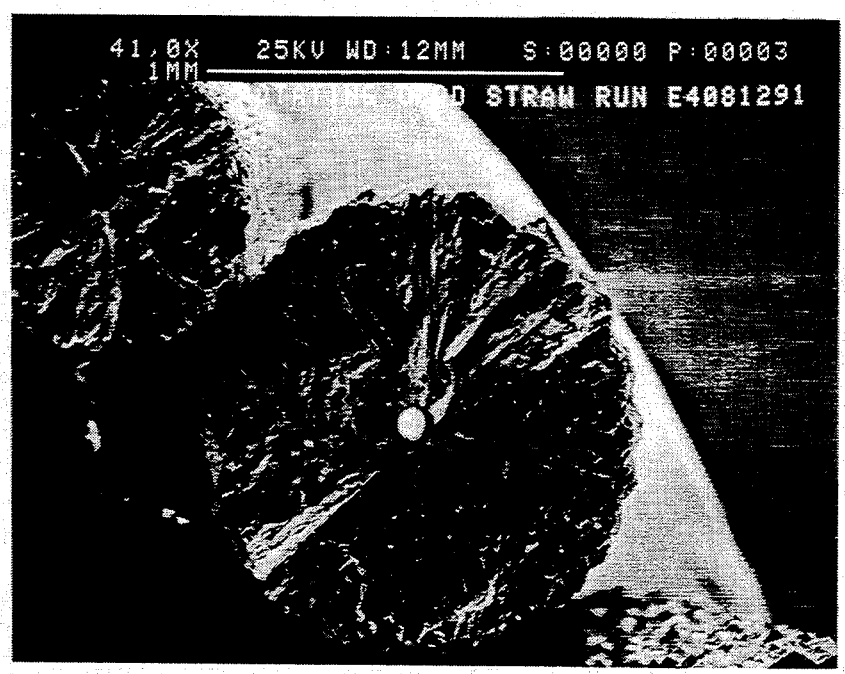
FIG. 1 is a photograph showing the inner diameter and grain structure of diamond tubes of this invention.

The present invention employs techniques analogous to conventional CVD processes wherein a pattern or core substrate is used in shaping a product, which pattern or core optionally may be removed, though not necessarily. If the pattern upon which the CVD diamond layer is deposited/grown in the present invention is removed from the CVD diamond layer, a three-dimensional diamond workpiece of desired configuration is produced. If the substrate is not removed, then a supported CVD diamond product results.

Conventional starting materials and process conditions for CVD diamond are useful in the present invention. For example, hydrocarbon sources can include alkane series gases, e.g., methane, ethane, propane; unsaturated hydrocarbons, e.g., ethylene, acetylene, cyclohexene, and benzene; and the like. Methane, however, is preferred. The molar ratio of hydrocarbon to hydrogen broadly ranges from about 1:10 to about 1:1,000 with about 1:100 being preferred. This gaseous mixture optionally may be diluted with an inert gas, e.g., argon. Most conventional reactors for CVD diamond are suitable for use in this invention where the gaseous mixture is at least partially decomposed thermally using the hot filament technique.

This technique involves the use of a hot filament which normally is formed of tungsten, molybdenum, tantalum, or alloys thereof. U.S. Pat. No. 4,707,384 illustrates such a process with greater particularity.

To provide the diamond tubes and other uniform coatings of the present invention, the CVD reactor is preferably configured to accept a single filament, preferably positioned vertically. Tungsten filaments of conventional sizes used for heating diamond tubes are acceptable. Such sizes are typically 0.030 inches in diameter and about 7 inches long.

The substrates are maintained at a temperature suitable for forming CVD-diamond which typically ranges from about 500° to 1100° C. and preferably is in the range of about 850° to 950° C. where diamond growth is at its highest rate in order to minimize grain size. The substrates are positioned about the hot filament at a distance which will permit such temperatures to be achieved so that the diamond will grow. Preferably, these substrates are 13 mm from the filament or less.

Pressures in the range of from about 0.01 to 1,000 Torr, advantageously about 1-800 Torr, are taught in the art, with reduced pressure being preferred. Details on CVD processes additionally can be reviewed by reference to Angus et al., "Low-Pressure, Metastable Growth of Diamond and 'Diamondlike' Phases," *Science*, Vol. 241, pp. 913-921 (Aug. 19, 1988); and Bachmann et al., "Diamond Thin Films," *Chemical Engineering News*, pp. 24-39 (May 15, 1989).

With respect to the substrates, it will be appreciated that the materials of construction necessarily must be stable at the elevated CVD diamond-forming temperatures required by the CVD processing employed. Accordingly, appropriate materials include, for example, metals (e.g., tungsten, molybdenum, silicon and platinum), alloys, ceramics (e.g., silicon carbide, boron nitride, aluminum nitride), glasses, and carbon (e.g., graphite). Substrates of mixed composition also may be utilized as is necessary, desirable, or convenient. Thicknesses as thin as 1 micrometer on up to 2,000 micrometers or more can be laid down, depending upon processing conditions and most importantly upon time.

Growth rates in the range of about 0.1-10 μm/hr. have been easily obtained, with energy requirements of only about 125-185 watts/in. of tungsten wire. The power depends on the length of wire and temperature of the filament. Higher growth rates of about 1.0 μm/hr. can be used after the initial deposition which provides coatings with an increasing particle size distribution gradient along their thickness.

A preferred substrate is one which is cross-sectionally uniform in size and shape. Most preferably, the substrate is a cylinder such as a wire or tube. Such a substrate surface will remain equidistant during rotation. Suitable wire substrates are those of molybdenum having an outer diameter of about 0.025-2.5 mm. More than one substrate is utilized and they are all positioned equidistant from the hot filament. These substrates are supported by a means which permits rotation along their axes parallel to the filament. The substrates are maintained at a uniform distance from the hot filament during rotation. Preferably, these substrates are rotated in unison to provide uniform coatings which are identical.

In the formation of diamond tubes with wire or tubular metal substrates, the metal substrates are acid leached away by conventional techniques following diamond deposition.

A substrate supporting apparatus suitable for performing the process of this invention, particularly those for forming diamond tubes, is one wherein each substrate is supported and rotated by a separate means, such as a single drive gear that is interlocked with others so that all rotate in unison. A suitable embodiment is one having over 6 substrates, preferably 10-15, supported on separate small gears with a diameter of less than 1 inch which are arranged equidistant from a single filament, preferably at about 0.5-2.0 inches. The drive gear is driven by a motor outside the reactor via a rotation motion feedthrough. Slow rotation is preferred. Rates of revolution in the range of 0.5 to 2.0 rph are suitable.

Figure 2:
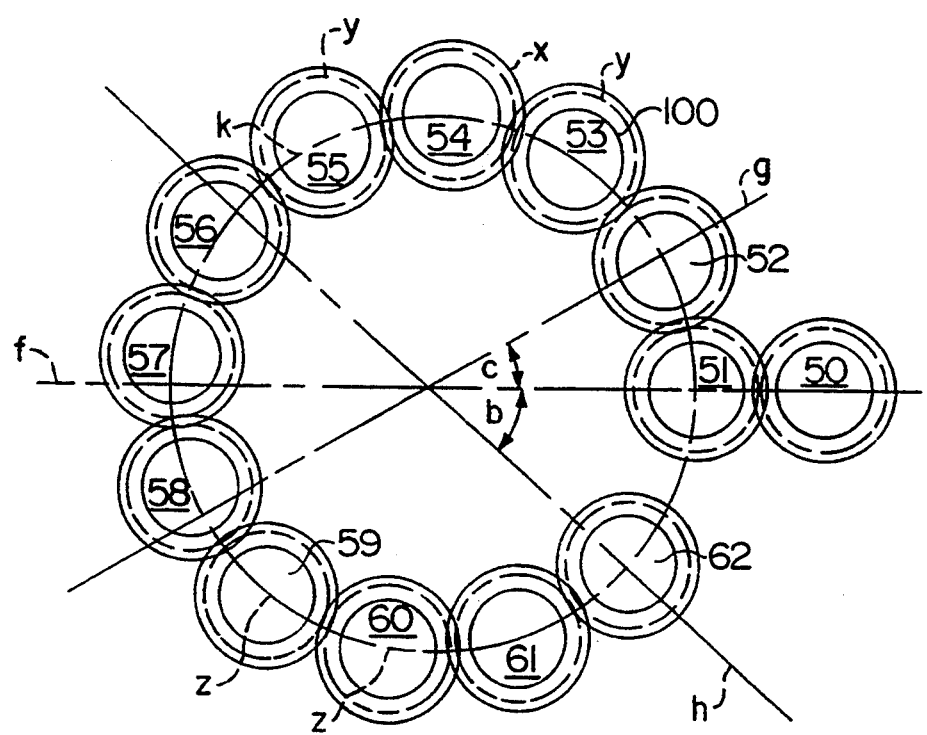
FIG. 2 is a schematic representation of the gear positioning within the drive used in the examples herein.

FIG. 2 illustrates, in abstract, a suitable gear configuration for a substrate holder which conforms to that used in the Examples herein. The gears are shown without gear teeth to better illustrate their positioning when intermeshed. A drive gear 50 is intermeshed with gears 51 through 62 so that all rotate in unison. The rotational axes Z of gears 51 through 62 are positioned in a circular configuration defined by circle K. An angle b is defined by a line f, which is the common axis of circle K and gear 51, and line h, which is the axis common to circle K and gear 62. An angle c is defined by the line f and a line g, which is the common axis of circle K and gear 52. Angle b is larger than angle c, which is preferred but not critical where an even number of gears are positioned on circle K. Holes 100 within gears 51 through 62 retain a wire substrate. Circles X define the maximum diameter of the gears 50 through 62, which is twice the distance from the tip of the gear teeth to the central axis Z. Circle Y defines the effective diameter of gears 50 through 62 when intermeshed.

After CVD diamond deposition on a cylindrical mandrel or wire, the mandrel-diamond can be cut into sections, e.g., using a Q-switched Nd-YAG laser. Of interest when making cylindrical tubes for use as water-jet mixing tubes, wire drawing dies, water-jet nozzles, or the like, is the characteristic bevel of the diamond layer which results utilizing the laser cutting technique. Such rough cut results in the inner lip or rim of the resulting CVD diamond layer protruding from the body of the diamond tube or annulus above the outer rim or edge thereof. When the molybdenum mandrel is removed, e.g., by etching, one or both ends of the tube can be polished. One end of the water-jet nozzles is typically polished since the ID edge of the high-pressure side of the nozzle is critical in forming a non-divergent water jet. In fact, the ID edge of the cylinder is important when the hole penetrating the tube is to be used, such as for a water-jet nozzle, wire-drawing die, or the like. Fortuitously, the use of the laser cutting technique substantially reduces the time it takes to polish the ID edge of the resulting CVD diamond tube.

Symmetrical cylinders which consist essentially of CVD diamond are also provided by this invention. These diamond tubes have a uniform inner diameter which varies by less than 0.1% in dimension along the tube length. These cylinders/tubes are preferably used as wire dies, mixing tubes, orifices or nozzles for water-jet cutting apparatus. The diameters typically range from 0.025 to 2.5 mm, and the wall thickness for these tubes preferably ranges from 1-2000 $\mu$m. In preferred embodiments, the tubes have a particle size distribution gradient along their wall thickness provided by varying the rate of diamond deposition. In preferred embodiments, grain sizes are small near the inner diameter and increase in size along the wall thickness with increasing distance from the inner diameter. Most preferably, the particle size gradient will support columnar growth in a radial direction from the inner diameter.

FIG. 1 is a side view of three diamond tubes of this invention. Two of the tubes are partially shown. The diamond tube in the center is shown to have a uniform inner diameter by the light passing therethrough and the symmetry of the hole which defines the inner diameter. This diamond tube and also the diamond tube in the left corner exhibit substantially uniform wall thicknesses and grain boundaries which extend radially from the inner diameter due in columnar growth. More grain boundaries appear near the inner diameter of these diamond tubes than near the outer circumference, which is consistent with larger grain size diamond being formed near the outer circumference. The diameter of the tubes is also shown to be substantially uniform.

An advantage of the process of this invention is that in producing a number of diamond tubes simultaneously, a plurality of tubes can be produced with substantially identical inner diameters, outer diameters and, more significantly, grain structure. Since each diamond tube produced during a synthesis run is exposed to substantially identical conditions, the grain structures are substantially identical. This common identity may be useful in comparative testing, when standardizing equipment and when finishing the parts. Preferably, the plurality of identical tubes comprises at least six tubes.

Preferably, each substrate is further supported on a holder or other means to be sure the substrate remains parallel to the filament during coating. Also preferred is the use of a radiation heat shield placed concentrically about the hot filament at a distance of about 1-2 inches from the filament to help the substrate wires achieve and maintain a temperature sufficient for diamond deposition and also to direct the gas flow down the tungsten filament.

The plurality of substrates contributes to the uniform heating. This apparatus is well suited for wire substrates; however, the substrate configuration can be varied widely, and substrates of a more complicated geometry and not cross-sectionally uniform can be used.

Without further elaboration, it is believed that one skilled in the art can, using the preceding description, utilize the present invention to its fullest extent. The preferred specific embodiments are, therefore, to be construed as merely illustrative, and not limitative of the remainder of the disclosure in any way whatsoever. One skilled in the art will recognize that process variables such as substrate temperature, flow rate and reactor configuration may require some variation from the preferred values given, depending on the specific equipment and conditions used.

The entire disclosure of all applications, patents and publications, cited above and below, are hereby incorporated by reference.

EXAMPLE

A CVD reactor is used which incorporates an apparatus for supporting and rotating a plurality of substrates. The substrates comprise 12 molybdenum wires (0.006 inches in diameter, 7 inches long) each attached to one of twelve stainless steel gears intermeshed in a circle about 1 inch in diameter and driven by one drive gear as shown in the figure. Angle b is about 41°3' and angle c is about 28°6' in the array. The diameter of the gear hole 100 is about 0.188 inches and the maximum outer diameter (Circle X) of the gear hole is about 0.281 inches. The gears are meshed so that their effective diameter is about 0.25 inches (Circle Y). The gears are positioned on shafts/pinions supported by a water-cooled aluminum platform. A bottom holder and guide attached to a weight secures the opposite end of the wires and is supported by a second water-cooled aluminum platform. The aluminum platforms are held by a water-cooled stainless steel post.

A flexible cable connects the drive gear to the rotating vacuum feed-through positioned in the reactor wall. A 1-2 rph motor drives the network. Positioned down the center of the substrate array is a single tungsten wire filament (0.030 inches in diameter, 5 inches long). The filament is attached to a sliding mechanism on the bottom platform so as to compensate for elongation due to carbonization. The D.C. power is connected to the sliding mechanism and the top platform is grounded. The gas enters the reaction zone through the top platform. A gas diffuser (optional) is used which runs parallel to the substrate wires to disperse gas along the axes of the substrates. It comprises a refractory metal tube with small holes along its axis. The filament and substrates are then surrounded by a molybdenum radiation shield which is cylindrical (0.10" thick×7½" long×2" diameter).

The reactor is run for about 11 days, during which time a mixture of hydrogen and methane gas (1-2 vol. %) at about 10 Torr is passed over the array while rotated at about 1.61 rph. The filament temperature is maintained at about 2000° C. The substrate temperatures are between 650°-800° C.

About 0.075 radius increase on the wires visible through a sight hole was noticed after 11 days. Growth was continued to 29 days and the coatings were still uniform.

The diamond tubes of FIG. 1 are produced following a similar coating procedure described above. The coated substrate wires are removed from the reactor after cool-down and the molybdenum wires are etched away, leaving the diamond tubes shown in FIG. 1. The inner diameter of a sample tube is found to be uniform within 0.1% on inspection of a random cross-section.

These procedures can be repeated utilizing different heat shield configurations, different filament temperatures (about 750°-800° C.), different substrate wires, different gas inlets, gas mixtures and gas pressures. From the foregoing description, one skilled in the art can easily ascertain the essential characteristics of this invention, and without departing from the spirit and scope thereof, can make various changes and modifications of the invention to adapt it to various usages and conditions.

What is claimed is:

1. A wire die comprising an annularly shaped diamond body with a central opening having an interior surface with a uniform diameter, said body comprising diamond grains having colunar growth extending in a radial direction from said interior surface wherein said diamond grains are smaller near said interior surface and larger with increasing distance along a radial direction away from said interior surface, said diamond grains having plurality of grain boundaries adjacent said interior surface.

2. A wire die according to claim 1 consisting essentially of a symmetrical cylinder of chemically vapor-deposited diamond having a uniform inner diameter which varies by less than 0.1% in dimension along the cylinder length.

3. A wire die according to claim 1 wherein said uniform inner diameter is in the range of 0.025 to 2.5 mm and varies by less than 0.1% in dimension along the length thereof, said annularly shaped body has a wall thickness in the range of 1-2,000 μm, and a particle size distribution gradient along the tube wall thickness.

4. A wire die according to claim 1 wherein said diamond grains are deposited diamond.

5. A wire die according to claim 4 wherein said diamond grains are deposited by a hot filament process.

* * * * *